(12) United States Patent
Cheng et al.

(10) Patent No.: US 7,144,490 B2
(45) Date of Patent: Dec. 5, 2006

(54) METHOD FOR SELECTIVE ELECTROPLATING OF SEMICONDUCTOR DEVICE I/O PADS USING A TITANIUM-TUNGSTEN SEED LAYER

(75) Inventors: Tien-Jen Cheng, Bedford, NY (US); David E. Eichstadt, North Salem, NY (US); Jonathan H. Griffith, Lagrangeville, NY (US); Sarah H. Knickerbocker, Hopewell Junction, NY (US); Rosemary A. Previti-Kelly, Burlington, VT (US); Roger A. Quon, Rhinebeck, NY (US); Kamalesh K. Srivastava, Wappingers Falls, NY (US); Keith Kwong-Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 260 days.

(21) Appl. No.: 10/707,047

(22) Filed: Nov. 18, 2003

(65) Prior Publication Data
US 2005/0103636 A1    May 19, 2005

(51) Int. Cl.
C25D 5/02 (2006.01)
C25D 7/12 (2006.01)
(52) U.S. Cl. ............... 205/118; 205/122; 205/123; 205/136; 205/157
(58) Field of Classification Search .......... 205/118, 205/122, 123, 135, 136, 157
See application file for complete search history.

(56) References Cited

U.S. PATENT DOCUMENTS

| 5,334,804 | A | * | 8/1994 | Love et al. ............... 174/267 |
|---|---|---|---|---|
| 5,486,282 | A | | 1/1996 | Datta et al. ............... 205/123 |
| 5,503,286 | A | * | 4/1996 | Nye et al. ............... 216/13 |
| 5,536,388 | A | | 7/1996 | Dinan et al. ............... 205/670 |
| 5,620,611 | A | | 4/1997 | Datta et al. ............... 216/13 |
| 6,140,234 | A | * | 10/2000 | Uzoh et al. ............... 438/678 |
| 6,293,457 | B1 | | 9/2001 | Srivastava et al. ......... 228/254 |
| 6,355,977 | B1 | | 3/2002 | Nakamura ............... 257/693 |
| 6,451,627 | B1 | | 9/2002 | Coffman ............... 438/111 |
| 6,534,863 | B1 | | 3/2003 | Walker et al. ............ 257/737 |
| 6,605,534 | B1 | * | 8/2003 | Chung et al. ............ 438/674 |
| 7,025,866 | B1 | * | 4/2006 | Collins ............... 205/118 |
| 2003/0057551 | A1 | | 3/2003 | Datta et al. ............... 257/737 |
| 2003/0082913 | A1 | | 5/2003 | Danielson et al. ......... 438/690 |

* cited by examiner

*Primary Examiner*—Nam Nguyen
*Assistant Examiner*—Luan V. Van
(74) *Attorney, Agent, or Firm*—Cantor Colburn LLP

(57) ABSTRACT

A method for selective electroplating of a semiconductor input/output (I/O) pad includes forming a titanium-tungsten (TiW) layer over a passivation layer on a semiconductor substrate, the TiW layer further extending into an opening formed in the passivation layer for exposing the I/O pad, such that the TiW layer covers sidewalls of the opening and a top surface of the I/O pad. A seed layer is formed over the TiW layer, and portions of the seed layer are selectively removed such that remaining seed layer material corresponds to a desired location of interconnect metallurgy for the I/O pad. At least one metal layer is electroplated over the remaining seed layer material, using the TiW layer as a conductive electroplating medium.

7 Claims, 4 Drawing Sheets

METHOD FOR SELECTIVE ELECTROPLATING OF SEMICONDUCTOR DEVICE I/O PADS USING A TITANIUM-TUNGSTEN SEED LAYER

BACKGROUND OF INVENTION

The present invention relates generally to semiconductor device processing and, more particularly, to a method for selective electroplating of semiconductor device I/O pads using a titanium-tungsten (TiW) seed layer.

In the manufacture of semiconductor devices, a selective plating process has been developed in order to plate copper, nickel, gold and other conductive metals on coils, vias, pads and other interconnect structures. In this selective plating process, electrical current is conducted through a layer of refractory metal (e.g., tantalum/tantalum nitride (Ta/TaN)) to plate metal on lines or pads using copper seed. The plating conditions are specifically designed so as to enable deposition on pre-patterned copper pads only, not on the Ta/TaN seed. Because there is no photoresist used during the plating process, any over-plating otherwise caused by delamination of photoresist and bath contamination due to photoresist leaching is eliminated. Moreover, through the use of nickel/gold plating, the sidewalls of the copper seed are completely covered with the nickel/gold, thereby providing excellent corrosion resistance with this "self-encapsulated" metallurgy and eliminating the need for an extra passivation layer.

In addition, the use of selective copper plating can afford the opportunity for reduced chemical-mechanical polishing (CMP) time since less "extraneous" copper is formed from the plating. Pads with nickel and gold may be used either for wirebonding with thicker gold or for lead-free solder paste screening as capture pads with a flash of gold. The gold on the capture pad is demonstrated to exhibit very low contact resistance, which is ideal for electrical testing before C4 bumping. Furthermore, the electroplated nickel and gold as terminal metals has demonstrated promising results in stress tests. More specifically, it has opened up tremendous opportunities for pitch reduction, as well as a more protective surface for low-k di-electrics underneath at a lower test force and better reliability performance. After the completion of the metal plating, the Ta/TaN seed layer is removed by either a reactive ion etch process or a CMP process.

However, conventional selective plating processes are not without their own disadvantages. First, there is a thickness uniformity issue associated with using a Ta/TaN seed layer. A Ta/TaN seed layer at 800 Angstroms (Å) is considered very resistive. In the case of copper plating, the edge areas can be plated to a thickness about twice that of the center areas, which is not acceptable for applications where copper uniformity is critical. Second, the presence of surface topography (e.g., corners or other defects) in the seed layer can dramatically increase local plating currents. In certain cases, these local currents can be too high and thus start to plate metal on the Ta/TaN seed. In turn, the over-plated metal nodules can short the electrical features of the device. Accordingly, the applied plating current density is kept fairly low, which results in longer plating times, as well as possibly changing the film microstructure and properties.

Still another disadvantage of conventional selective plating results from the Ta/TaN removal process (i.e., reactive ion etching). A reactive ion etch (RIE) process has the effect of removing some gold from the surface. Although the loss of gold can be compensated for, the redeposition of gold on the manufacturing tool presents a manufacturing concern. On the other hand, a resulting thinner gold layer can lead to wire bond failures. CMP is also not a desirable method for Ta/TaN seed removal, due to the topographic features of the structure. A third possibility is a wet chemical etch to remove the Ta/TaN seed, however the etchant materials are difficult to handle from a manufacturing standpoint.

Accordingly, it would be desirable to implement a selective plating process that also allows for higher conductivity and tool throughput, and without the disadvantages as mentioned above.

SUMMARY OF INVENTION

The foregoing discussed drawbacks and deficiencies of the prior art are overcome or alleviated by a method for selective electroplating of a semiconductor input/output (I/O) pad. In an exemplary embodiment, the method includes forming a titanium-tungsten (TiW) layer over a passivation layer on a semiconductor substrate, the TiW layer further extending into an opening formed in the passivation layer for exposing the I/O pad, such that the TiW layer covers sidewalls of the opening and a top surface of the I/O pad. A seed layer is formed over the TiW layer, and portions of the seed layer are selectively removed such that remaining seed layer material corresponds to a desired location of interconnect metallurgy for the I/O pad. At least one metal layer is electroplated over the remaining seed layer material, using the TiW layer as a conductive electroplating medium.

In another aspect, a semiconductor input/output (I/O) pad structure includes a titanium-tungsten (TiW) layer formed into an opening formed in a passivation layer on a semiconductor substrate, the opening created for exposing an I/O pad, such that said TiW layer further covers sidewalls of the opening and a top surface of the I/O pad. A seed layer is formed over a portion of the TiW layer and corresponding to a desired location of interconnect metallurgy for the I/O pad. At least one metal layer is electroplated over the seed layer, wherein the TiW layer serves as a conductive electroplating medium.

BRIEF DESCRIPTION OF DRAWINGS

Referring to the exemplary drawings wherein like elements are numbered alike in the several Figures.

DETAILED DESCRIPTION

Disclosed herein is a method and structure for selective electroplating of semiconductor device I/O pads using a titanium-tungsten (TiW) seed layer. The TiW seed layer provides improved plating uniformity and significantly increased conductivity as compared to a Ta/TaN conducting seed layer. In addition, the use of TiW as described below addresses sputtering concerns of Ta/TaN on polyimides, as well as gold loss during reactive ion etching.

Figure 1:
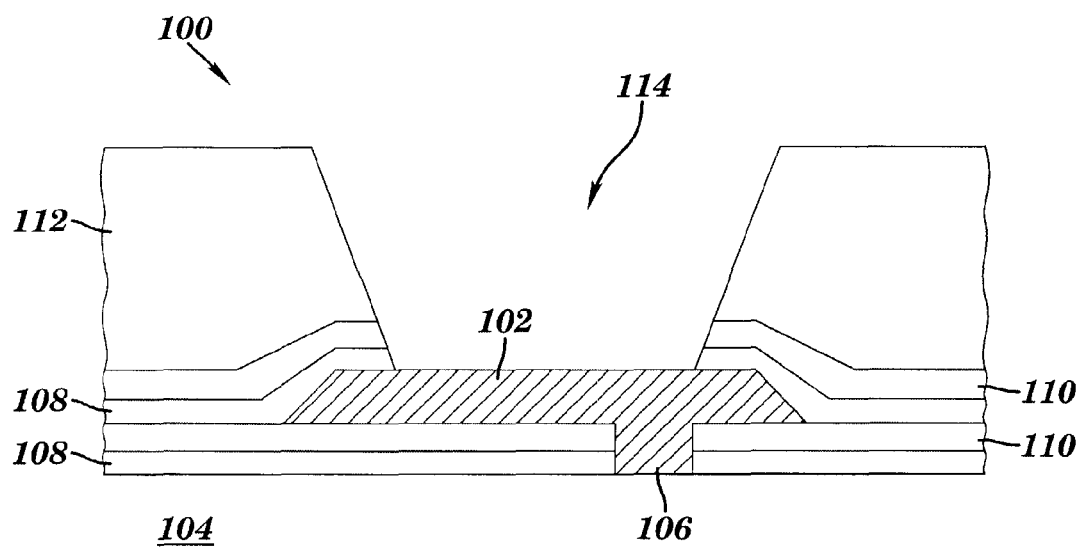
FIGS. 1 through 8 illustrate various processing steps of a method for selective electroplating of semiconductor device I/O pads using a titanium-tungsten (TiW) seed layer, in accordance with an embodiment of the invention.

Referring initially to FIG. 1, there is shown a cross-sectional view of an exemplary terminal metal (TD) aluminum bond pad structure 100, suitable for use in accordance with an embodiment of the invention. The structure 100 features an aluminum bond pad 102 formed at an uppermost metallization level of a semiconductor substrate 104, and which serves to provide an external connection to the active devices (not shown) formed in the substrate through various levels of interconnect structures there between, including an aluminum filled via 106. Surrounding the aluminum pad 102 and via 106 are alternating layers of dielectric 108 (e.g., $SiO_2$ or low-k material) and pad nitride 110 (e.g., $Si_3N_4$), as will be recognized by those skilled in the art. In addition, a passivation layer, such as a photosensitive polyimide (PSPI) layer 112 is formed over the topmost pad nitride layer 110.

Figure 2:
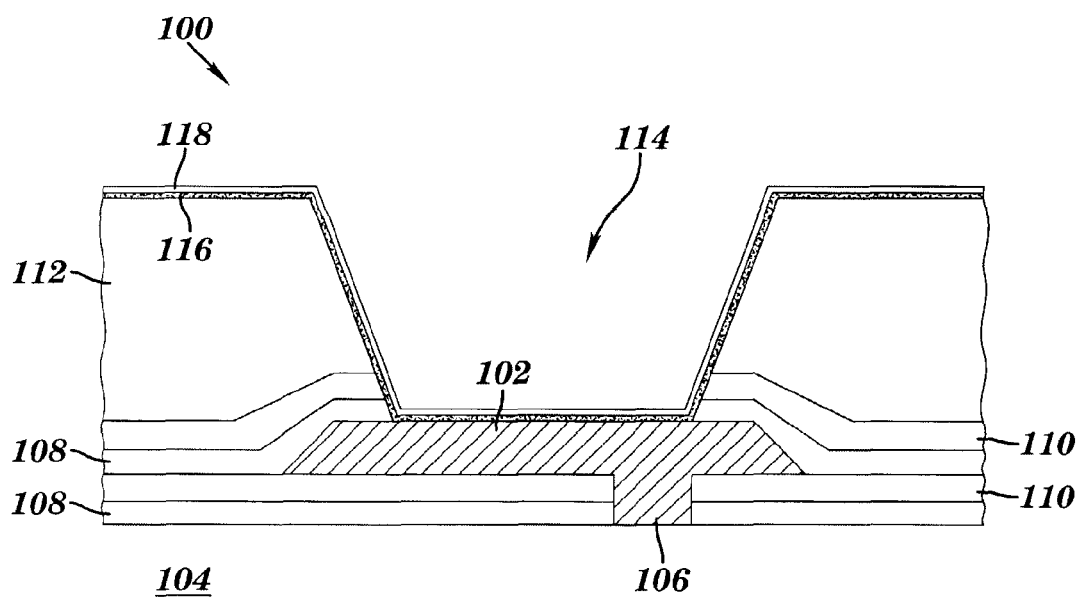

In order to provide access for a suitable external connection, a via or opening 114 is formed over the top surface of the aluminum pad 102. As shown in FIG. 2, a layer 116 of titanium-tungsten (TiW) is deposited over the entire structure (including the sidewalls of the via 114 and the top of the aluminum pad 102), followed by a layer 118 of copper/chrome-copper (Cu/CrCu) seed. Although FIG. 2 depicts layer 118 as a single layer, it should be understood that the Cu/CrCu seed may be a multilayer. As stated earlier, the entire layer 118 of Cu/CrCu was heretofore used as a seed layer, with all regions outside of the via area being protected with photoresist during the plating step, such that the plating metal would only be formed on the exposed portions of the Cu/CrCu. In the present method, however, the Cu/CrCu is first removed in all locations except for the via 114 region where the interconnect metallurgy is to be formed.

Figure 3:
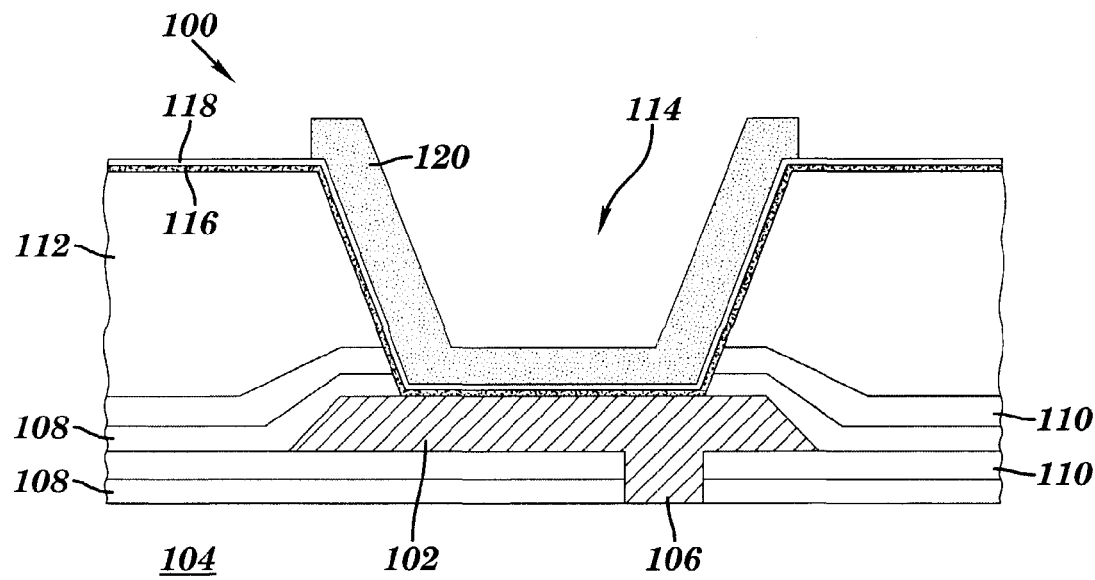
Figure 4:
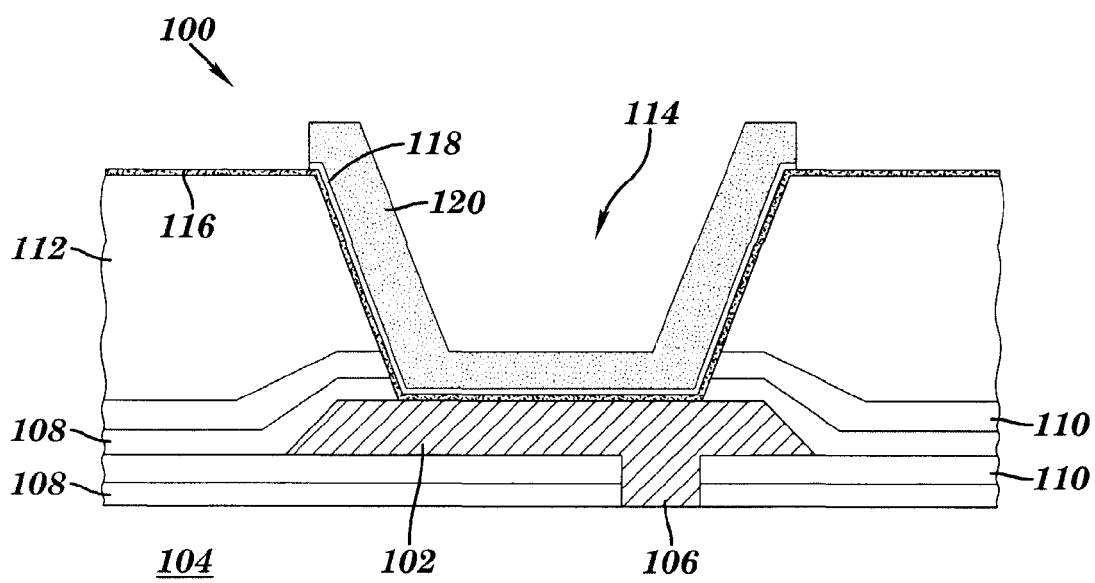
Figure 5:
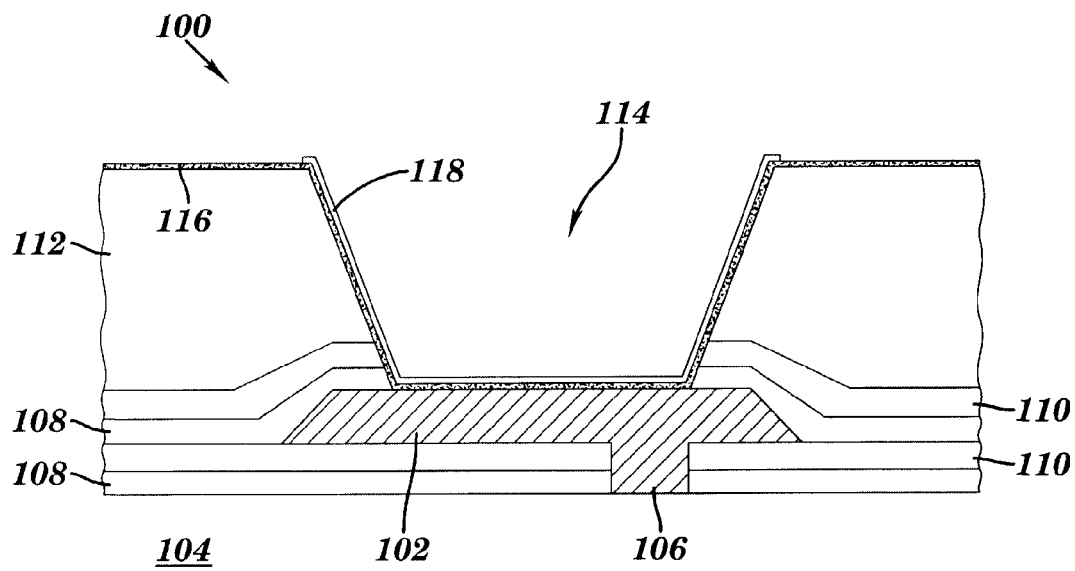
Figure 6:
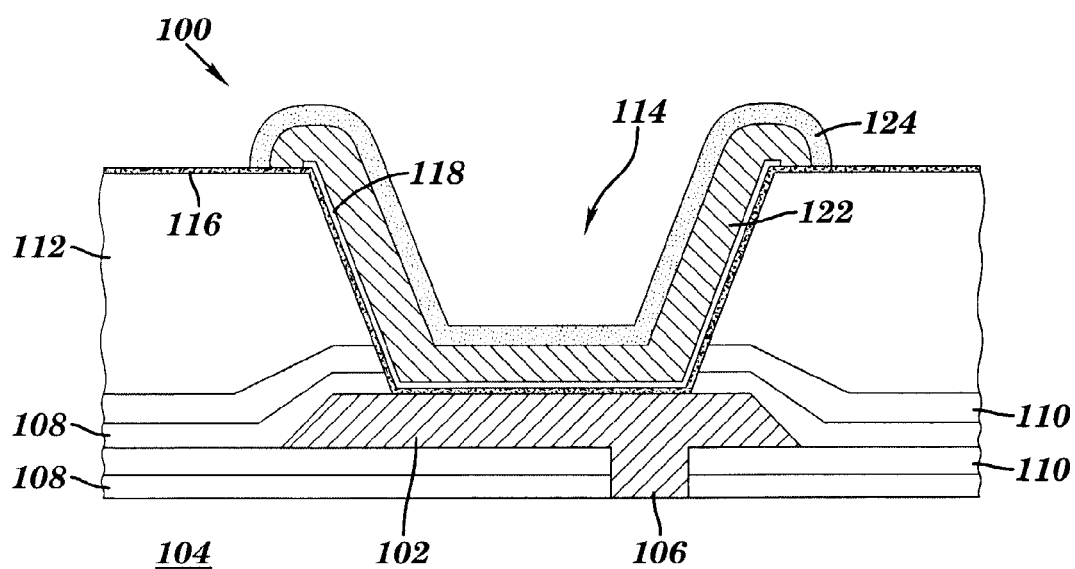
Figure 7:
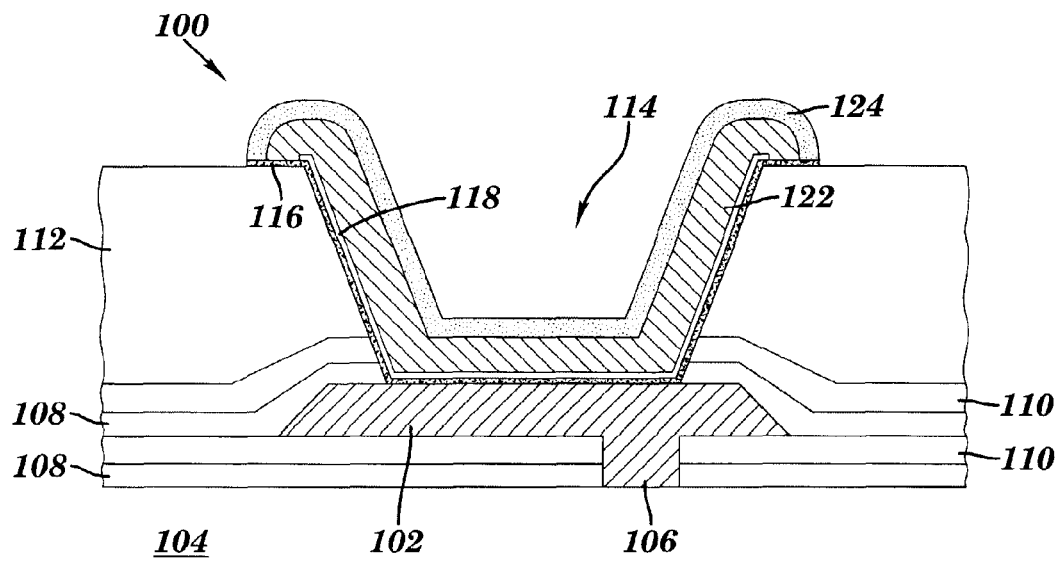

Accordingly, FIG. 3 illustrates the patterning of the via 114 regions (at which the Cu/CrCu 118 layer is to remain) with photoresist 120. Thereafter, the unmasked portions of the Cu/CrCu layer 118 are electroetched away, stopping on the TiW layer 116 as shown in FIG. 4. Additional information regarding electroetch processes and techniques may be found, for example, in U.S. Pat. No. 5,486,282 to Datta et al. and in U.S. Pat. No. 5,536,388 to Dinan et al., the contents of which are incorporated herein in their entirety. Then, the remaining photoresist 120 is stripped away (FIG. 5), and the electroplating of a nickel layer 122 and gold layer 124 is implemented as shown in FIG. 6. Because the Cu/CrCu layer 118 is only present in the via 114 regions, it acts as a seed layer for the electroplating. Furthermore, the continuous TiW layer 116 acts as the current carrying layer for providing the electroplating conductivity, but none of the electroplated material (Ni, Au) is formed thereupon. This may be accomplished by balancing the applied potential so that the nickel will nucleate on the Cu/CrCu seed layer 118, but not on the TiW layer 116.

Figure 8:
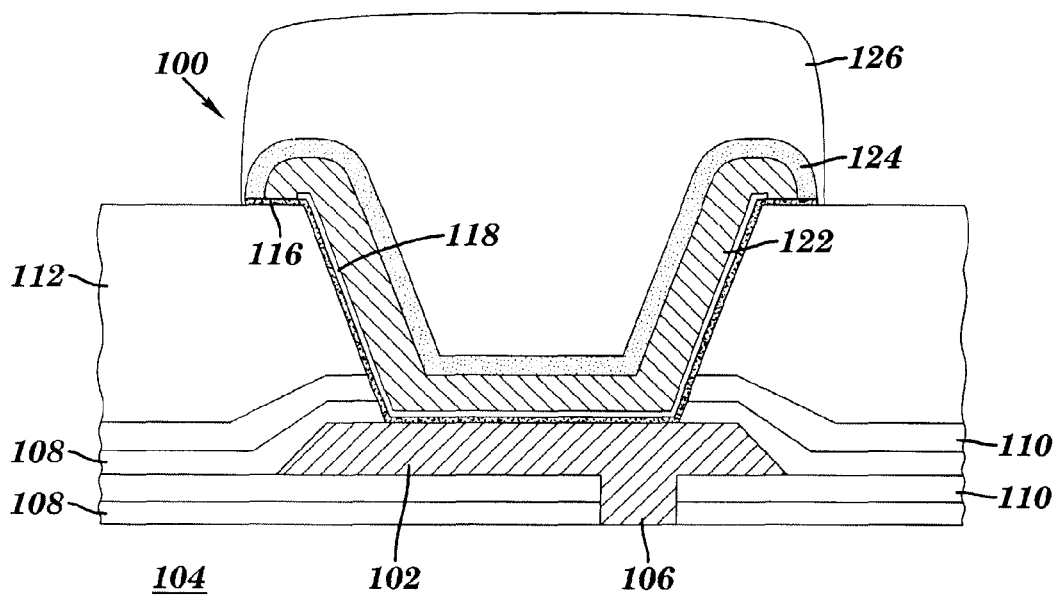

It will also be noted from FIG. 6 that, in contrast to conventional electroplating with a protected Cu/CrCu seed layer, the sidewalls of the remaining Cu/CrCu material in the via 114 regions are encapsulated by the electroplated material, since there is no photoresist present during the actual electroplating step. This results in improved corrosion resistance of the Cu/CrCu material. Once the interconnect metallurgy is formed, the remaining portions of TiW layer 116 not covered by the interconnect metallurgy are removed by a wet etch. Finally, as shown in FIG. 8, the bond pad structure 100 is ready for a subsequent processing step, such as the addition of a lead-free solder paste 126 in preparation for C4 ball attachment, for example. Alternatively, a wire-bond attachment could also be used in conjunction with the bond pad structure 100.

The use of TiW as a conductive electroplating seed material offers several advantages with respect to a Ta/TaN layer. First, the seed thickness of the TiW can be applied vup to about 6000 Å, providing good coverage over the surface topography and also lowering the sheet resistance. For example, such a thickness of TiW is estimated to be about 10 times as conductive than a Ta liner formed at about 700 Å, leading to better plating uniformity. In addition, TiW has a higher overpotential for nickel and gold plating. As such, the amount of electrical current that may be passed through a TiW layer can be about three times greater than for a Ta/TaN layer, and without the formation of nodules on the layer. This results in improved tool throughput by about 300%. Also, because TiW is an established material for C4 ball limiting metallurgy (BLM), the TiW etch process may be easily implemented with a hydrogen peroxide chemistry and end-point detection control. An exemplary TiW etch process is described in U.S. Pat, No. 6,293,457 to Srivastava, et al., the contents of which are incorporated herein in their entirety. Moreover, the thickness of the gold layer is undisturbed during the TiW etch process.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A method for selective electroplating of a semiconductor input/output (I/O) pad, the method comprising:
    forming a titanium-tungsten (TiW) layer over a passivation layer on a semiconductor substrate, said TiW layer further extending into an opening formed in said passivation layer for exposing the I/O pad, such that said TiW layer covers sidewalls of said opening and a top surface of the I/O pad;
    forming a seed layer over said TiW layer;
    selectively etching portions of said seed layer, down to the top of said TiW layer, such that remaining seed layer material correspond to a desired location of interconnect metallurgy for the I/O pad; and
    electroplating at least one metal layer over said remaining seed layer material, and thereby encapsulating exposed outer sidewalls thereof with respect to said TiW layer, using said TiW layer as a conductive electroplating medium, wherein said electroplating is implemented without a photoresist present during the electroplating step.

2. The method of claim 1, wherein said seed layer further comprises a Cu over CrCu layer.

3. The method of claim 1, wherein said at least one metal layer further comprises a nickel layer followed by a gold layer.

4. The method of claim 1, further comprising removing portions of said TiW layer not covered by said at least one metal layer following electroplating thereof.

5. The method of claim 1, wherein the I/O pad further comprises an aluminum pad.

6. The method of claim 1, wherein said seed layer is selectively removed by photoresist patterning.

7. The method of claim 1, wherein said passivation layer further comprises a photosensitive polyimide (PSPI) layer.

* * * * *